(12) United States Patent
Takahashi et al.

(10) Patent No.: US 8,526,229 B2
(45) Date of Patent: Sep. 3, 2013

(54) SEMICONDUCTOR MEMORY DEVICE

(75) Inventors: Hiroyuki Takahashi, Kanagawa (JP);
Naoki Ookuma, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/610,171

(22) Filed: Sep. 11, 2012

(65) Prior Publication Data

US 2013/0051172 A1 Feb. 28, 2013

Related U.S. Application Data

(63) Continuation of application No. 12/912,309, filed on Oct. 26, 2010, now Pat. No. 8,284,598.

(30) Foreign Application Priority Data

Oct. 27, 2009 (JP) ................................. 2009-246322

(51) Int. Cl.
*G11C 11/34* (2006.01)

(52) U.S. Cl.
USPC ...................... 365/182; 365/189.09; 365/226

(58) Field of Classification Search
USPC ..................... 365/182, 189.09, 226
See application file for complete search history.

(56) References Cited

U.S. PATENT DOCUMENTS

| | | | |
|---|---|---|---|
| 5,587,648 A | 12/1996 | Jinbo et al. | |
| 6,147,925 A | 11/2000 | Tomishima et al. | |
| 6,233,187 B1 | 5/2001 | Tsuchiya | |
| 6,822,921 B2 | 11/2004 | Otsuka | |
| 6,954,103 B2 | 10/2005 | Yamauchi et al. | |
| 7,158,424 B2 | 1/2007 | Ohtsuka et al. | |
| 7,656,736 B2 | 2/2010 | Akiyama et al. | |
| 8,004,923 B2 | 8/2011 | Akiyama et al. | |
| 8,009,500 B2 | 8/2011 | Nii et al. | |
| 8,451,678 B2 | 5/2013 | Akiyama et al. | |
| 2003/0081461 A1* | 5/2003 | Yamauchi et al. | 365/189.09 |
| 2003/0189869 A1* | 10/2003 | Yamagata et al. | 365/226 |
| 2003/0223302 A1 | 12/2003 | Otsuka | |
| 2004/0027907 A1* | 2/2004 | Ooishi | 365/226 |
| 2005/0128786 A1 | 6/2005 | Ohtsuka et al. | |
| 2007/0216467 A1 | 9/2007 | Akiyama et al. | |
| 2009/0141569 A1 | 6/2009 | Nii et al. | |
| 2010/0165776 A1* | 7/2010 | Tada | 365/226 |

FOREIGN PATENT DOCUMENTS

| | | |
|---|---|---|
| JP | 6-44779 A | 2/1994 |
| JP | 7-220472 A | 8/1995 |
| JP | 2000-40396 A | 2/2000 |
| JP | 2000-215660 A | 8/2000 |
| JP | 2001-35151 A | 2/2001 |
| JP | 2003-338178 A | 11/2003 |

(Continued)

*Primary Examiner* — Tuan T. Nguyen
(74) *Attorney, Agent, or Firm* — Foley & Lardner LLP

(57) ABSTRACT

A semiconductor memory device includes a power supply circuit configured to supply an intermediate voltage between a power supply voltage and a ground voltage to each of a plurality of memory cells. The power supply circuit firsts generates a first intermediate voltage between the power supply voltage and the ground voltage and a second intermediate voltage between the power supply voltage and the ground voltage. In response to a first control signal, the first intermediate voltage is supplied to an output node and the second intermediate voltage stops. A connection control circuit connects the first output node and a second output node when the second intermediate voltage generating circuit stops its operation.

18 Claims, 7 Drawing Sheets

(56) References Cited

FOREIGN PATENT DOCUMENTS

| | | |
|---|---|---|
| JP | 2004-063057 A | 2/2004 |
| JP | 2005-174432 | 6/2005 |
| JP | 2007-51351 A | 9/2007 |

* cited by examiner

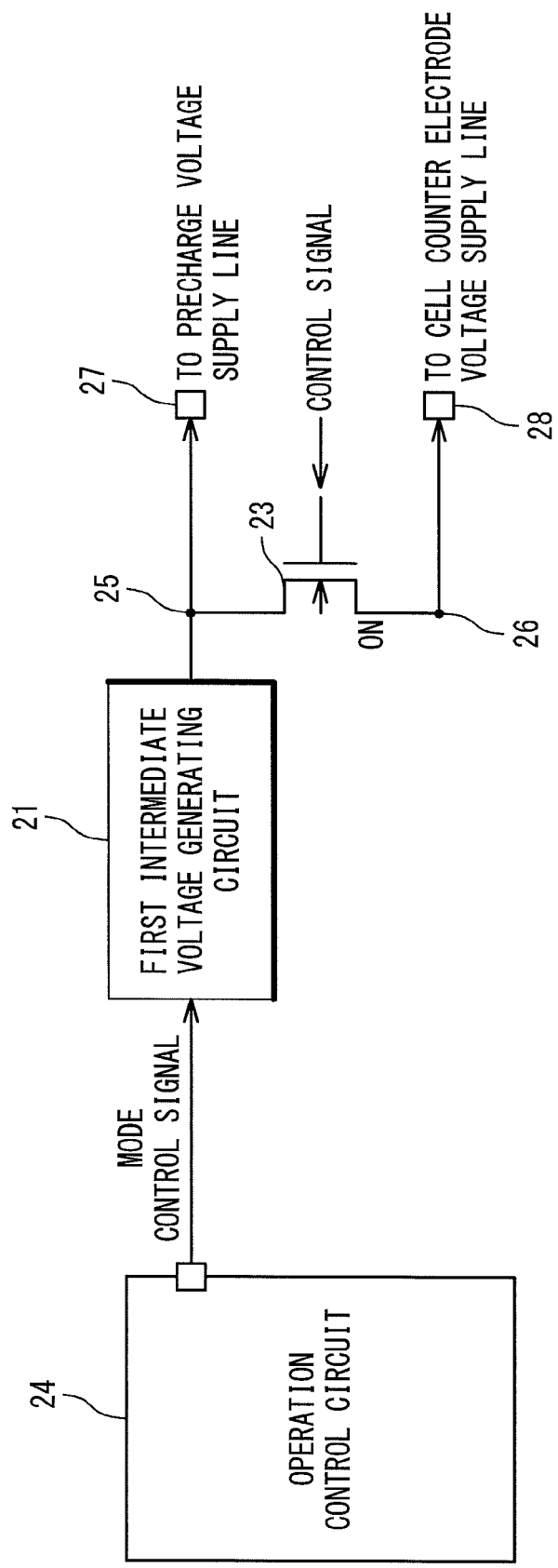

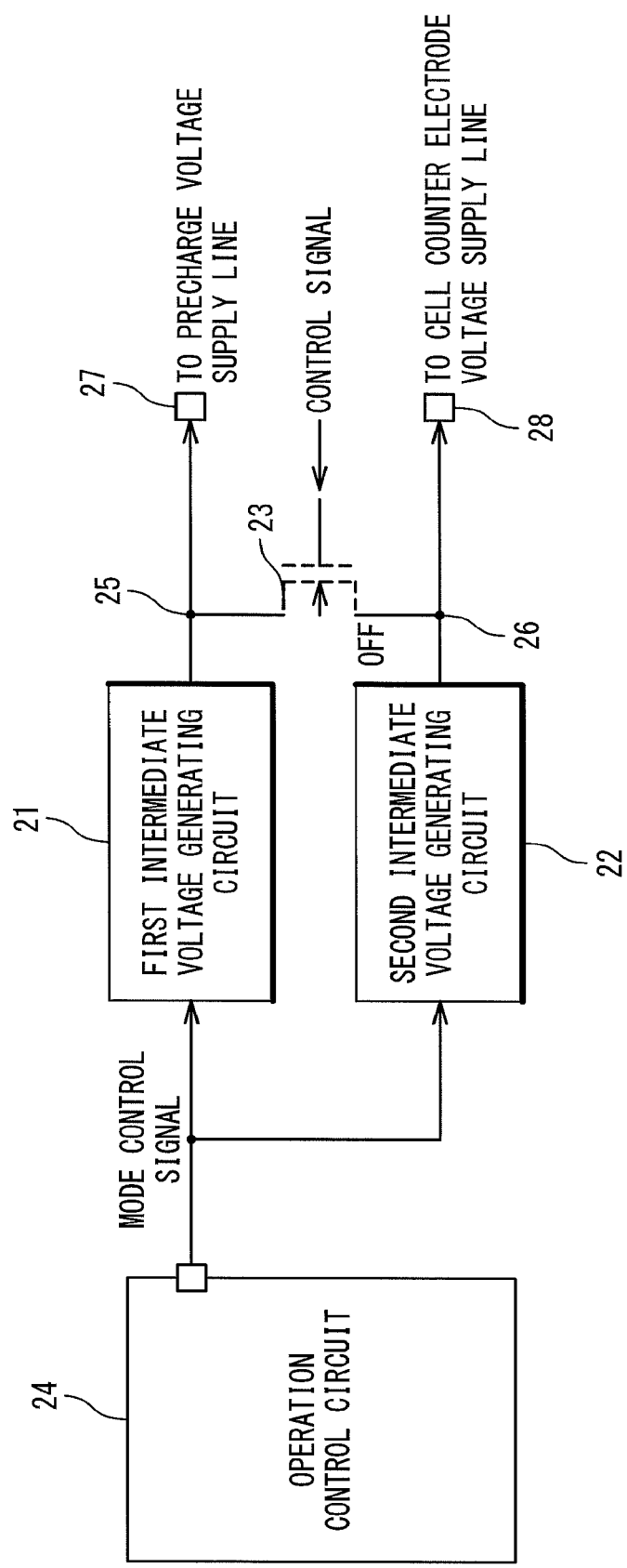

SEMICONDUCTOR MEMORY DEVICE

This application is a Continuation of U.S. patent application Ser. No. 12/912,309, filed Oct. 26, 2010, which claims priority to Japanese Patent Application No. 2009-246322, filed on Oct. 27, 2009. The disclosures thereof are incorporated herein by reference.

TECHNICAL FIELD

The present invention relates to a semiconductor memory device, and especially to a semiconductor memory device provided with a circuit for supplying an intermediate voltage between a power supply voltage and the ground voltage.

BACKGROUND ART

A semiconductor memory device such as a DRAM and an SRAM is mounted on many electronic devices which are popular at present. For example, the DRAM is provided with a plurality of memory cells. A capacitance element and a switching transistor are provided for each of the plurality of memory cells. One of source/drain electrodes of the switching transistor is connected with one of electrodes of the capacitance element. The other of the source/drain electrodes of the switching transistor is connected with a data line and an intermediate voltage between a power supply voltage and the ground voltage is supplied. Also, the intermediate voltage between the power supply voltage and the ground voltage is supplied to the other electrode of the capacitance element.

Most of the semiconductor memory devices available at present are compatible to a test mode. In the test mode, a test voltage is supplied to the one end (hereinafter, the cell counter electrode voltage) of the capacitance element of the DRAM cell and the operation is tested. At that time, a defective memory cell is detected, and it is replaced with a substitution memory cell if possible. The semiconductor memory device corresponding to the test mode is known (For example, refer to Patent Literature 1).

The Patent Literature 1 describes a technique of a semiconductor memory device which uses ½ of a power supply voltage (hereinafter, ½ Vcc) for setting a cell counter electrode voltage and precharging a digit line. Referring to the Patent Literature 1, a conventional semiconductor memory device is provided with a HVCC level generating circuit 101 which generates a ½ Vcc level and a short-circuiting circuit 103 to short-circuit the cell counter electrode line HVCP1 and the precharge line HVCD. The HVCC level generating circuit 101 is provided with the HVCC level generating section which generates the ½ Vcc and a test circuit which has an on/off controlled transistor in response to a test mode signal.

Also, the short-circuiting circuit 103 is provided with a test circuit which has an on/off controlled transistor in response to the test mode signal. One of the transistors is a transfer gate, and short-circuits the cell counter electrode line HVCP1 and the precharge line HVCD. At the time of the test mode, the transfer gate is set to an off-state in response to the test mode signal. Also, at this time, a test is carried out by setting the cell counter electrode line HVCP1 to the power supply voltage (Vcc) or the ground voltage (GND) in response to the test mode signal.

In the technique of the Patent Literature 1, a plurality of the short-circuiting circuits 103 are arranged in the cell array. A plurality of transfer gates sometimes causes increase of a chip area in the semiconductor memory device. a technique is known which is provided with a power supply circuit which generates a cell counter electrode voltage in the test mode separately from a power supply circuit which supplies a precharge voltage, in order to restrain the increase of the chip area (For example, Patent Literature 2).

CITATION LIST

[Patent Literature 1]: JP 2000-215660A
[Patent Literature 2]: JP-A-Heisei 06-44779

SUMMARY OF THE INVENTION

In recent years, to restrain the increase of a power consumption amount due to miniaturization, a semiconductor memory device has been spread which has a standby mode in addition to operation modes such as a normal operation mode and a test mode. When a power supply circuit is provided to generate a cell counter electrode voltage in the test mode, the power consumption amount in the standby mode has sometimes increased. The technique is demanded which can restrain the increase of the chip area and also restrain the increase of the power consumption amount while corresponding to these operation modes.

Also, in the semiconductor memory device, the test is sometimes carried out by using various test voltages in a test mode. A technique is required which can supply the test voltages in the test mode in addition to the power supply voltage and the ground voltage while restraining the increase of a power consumption amount.

In an aspect of the present invention, a semiconductor memory device includes: a memory cell array provided with a plurality of memory cells in a matrix; and a power supply circuit configured to supply an intermediate voltage between a power supply voltage and a ground voltage to each of the plurality of memory cells. The power supply circuit includes: a first intermediate voltage generating circuit configured to generate a first intermediate voltage between the power supply voltage and the ground voltage; a second intermediate voltage generating circuit configured to generate a second intermediate voltage between the power supply voltage and the ground voltage; a first output node to which the first intermediate voltage is supplied; a second output node to which the second intermediate voltage is supplied; and a connection control circuit provided between the first output node and the second output node. The first intermediate voltage generating circuit supplies the first intermediate voltage in response to a first control signal, and the second intermediate voltage generating circuit stops its operation in response to the first control signal. The connection control circuit connects the first output node and the second output node when the second intermediate voltage generating circuit stops its operation.

In another aspect of the present invention, a semiconductor memory device includes: a memory cell; and a power supply circuit configured to supply to the memory cell a predetermined voltage between a first power supply voltage and a second power supply voltage which is lower than the first power supply voltage. The power supply circuit includes: first and second output nodes; first and second intermediate voltage generating circuits connected with the first and second output nodes, respectively; and a connection control circuit provided between the first and second output nodes. The predetermined voltage is supplied to the first and second output nodes by using both of the first and second intermediate voltage generating circuits or only the first intermediate voltage generating circuit based on a combination of an active state of the connection control circuit, and active states of the first and second intermediate voltage generating circuits.

The technique is provided which can deal with a plurality of operation modes while restraining the increase of a chip area and restraining the increase of a power consumption amount.

Also, in the semiconductor memory device, a test is sometimes carried out by using various test voltages in the test mode. While restraining an increase to the power consumption amount, the test voltage can be supplied in addition to the power supply voltage and the ground voltage in the test mode.

BRIEF DESCRIPTION OF THE DRAWINGS

The above and other objects, advantages and features of the present invention will be more apparent from the following description of certain embodiments taken in conjunction with the accompanying drawings, in which:

FIG. 5A is a block diagram showing a state of the voltage generating block in a standby mode;

FIG. 5B is a block diagram showing a state of the voltage generating block in a test mode.

DESCRIPTION OF EMBODIMENTS

Figure 1:
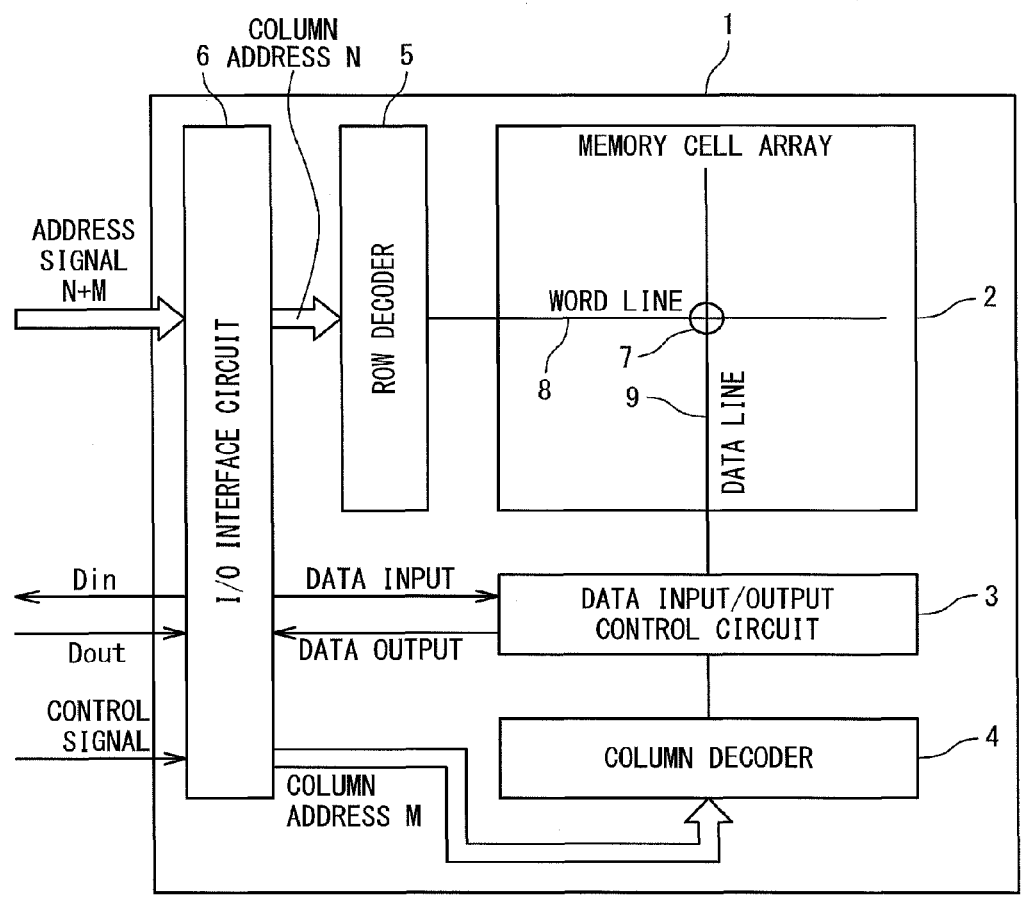
FIG. 1 is a block diagram showing a configuration of a whole semiconductor memory device according to an embodiment of the present invention.

Hereinafter, a semiconductor memory device of the present invention will be described with reference to the attached drawings. It should be noted that same or similar reference numerals or symbols are assigned to same or similar components in the following description.

FIG. 1 is a block diagram showing the configuration of the whole semiconductor memory device 1 according to an embodiment of the present invention. The semiconductor memory device 1 in the present embodiment generally has a normal operation mode, a standby mode and a test mode. Those modes are switched in response to a control signal supplied from an external unit.

As shown in FIG. 1, the semiconductor memory device 1 is provided with a memory cell array 2, a data input/output control circuit 3, a column decoder 4, a row decoder 5 and an I/O interface circuit 6. Also, the memory cell array 2 is provided with a plurality of memory cells 7. Each of the plurality of memory cells 7 is connected with a word line 8, and a data line pair 9. Predetermined voltages are supplied to the word line 8, and the data line pair 9 in accordance with the plurality of modes.

Figure 2:
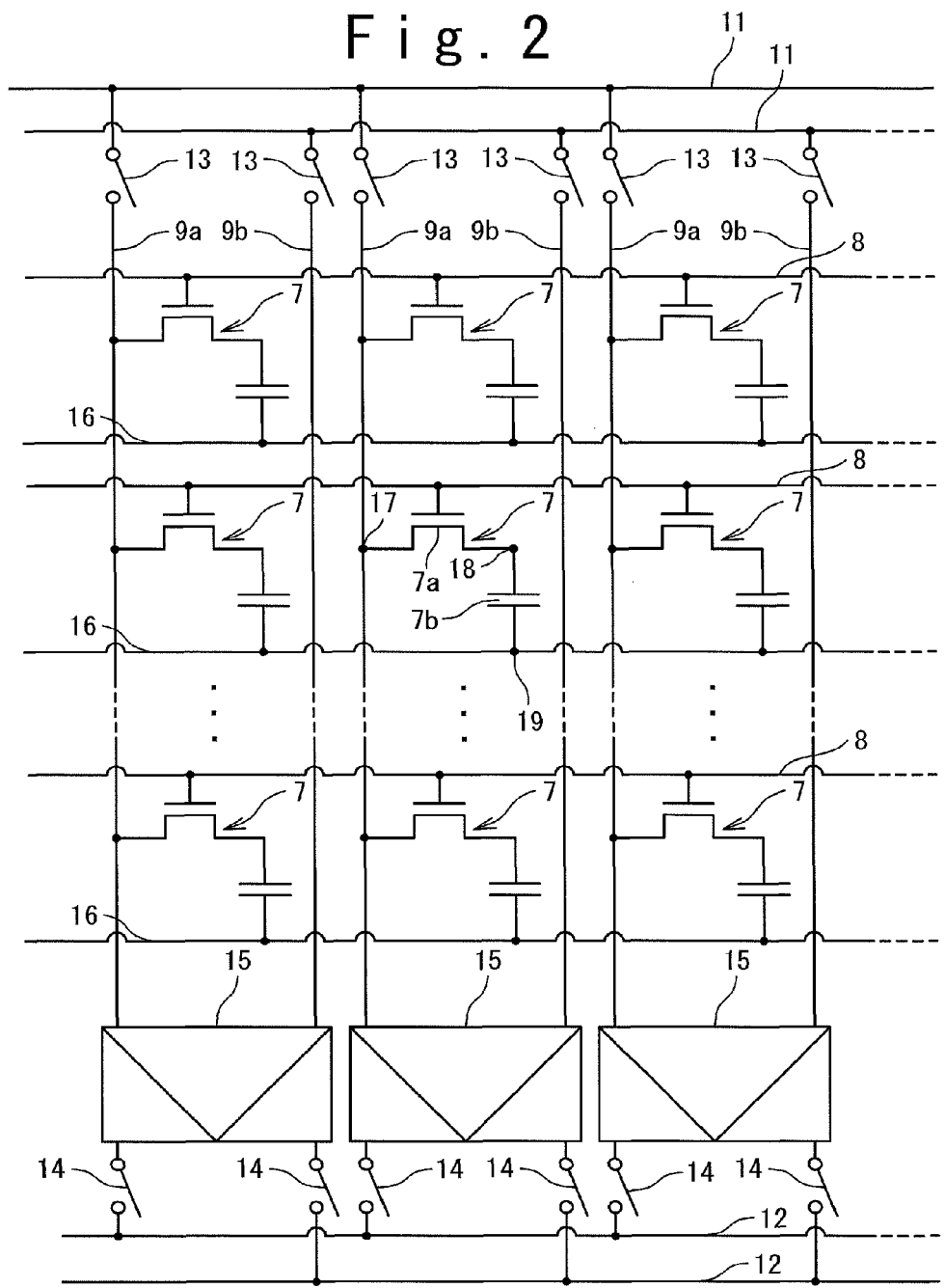
FIG. 2 is a circuit diagram showing a configuration of the semiconductor memory device in the present embodiment.

FIG. 2 is a circuit diagram showing the detailed configuration of the semiconductor memory device 1 in the present embodiment. The semiconductor memory device 1 in the present embodiment is provided with precharge voltage supply lines 11, common data input/output lines 12 and sense amplifiers 15. Also, each of the data line pairs 9 contains a first data line 9a and a second data line 9b. The precharge voltage supply lines 11 are connected with the first data line 9a and the second data line 9b through precharge switches 13, respectively. Also, the common data input/output lines 12 are connected with the first data line 9a and the second data line 9b through line selector switches 14, respectively. The sense amplifier 15 is connected with the first data line 9a and the second data line 9b and detects and amplifies signal voltages on the first data line 9a and the second data line 9b.

The memory cell 7 in the present embodiment is provided with a switching transistor 7a and a capacitance element 7b. One of the source/drain diffusion layers of the switching transistor 7a is connected with the first data line 9a through a first connection node 17. Also, the other of the source/drain diffusion layers of the switching transistor 7a is connected with the capacitance element 7b through a second connection node 18. Moreover, the capacitance element 7b is connected with a cell counter electrode voltage supply line 16 through a third connection node 19. The cell counter electrode voltage supply line 16 is connected with a voltage generating block (power supply circuit) 10 to be described later. Also, the data line pair 9 is connected with the voltage generating block 10 to be described later.

The semiconductor memory device 1 in the present embodiment performs a precharge operation, a write operation and a read operation. As shown in FIG. 2, in the semiconductor memory device 1 of the present embodiment, in case of the precharge operation, the precharge voltages are supplied to the first data line 9a and the second data line 9b in a state that all the word lines 8 are set to 0 (a low level). In case of the write operation, voltages corresponding to a write data and an inverted write data are supplied to the first data line 9a and the second data line 9b and one word line 8 is selected to charge the capacitance element 7b of the memory cell 7 to a write voltage or discharge to 0 V. In case of the read operation from the memory cell 7, the word line 8 is set to a read voltage to activate the switching transistor 7a. At this time, the discharge current flows through the first data line 9a so that the voltage on the first data line 9a changes instantaneously. The sense amplifier 15 detects the voltage change to determine whether the data is "1" or "0". The semiconductor memory device 1 in the present embodiment performs the above-mentioned operations in the normal operation mode.

Also, the semiconductor memory device 1 in the present embodiment supplies various voltage to the cell counter electrode voltage supply line 16 which connects with the capacitance element 7b, in the test mode and examines the operation of memory cell 7. At the time, a defective memory cell 7 is detected and replaced with a substitution memory cell, if possible. Moreover, in the standby mode, to reduce a power consumption amount, the precharge voltage supply lines 11 are driven in less power than in the operation mode.

Figure 3:
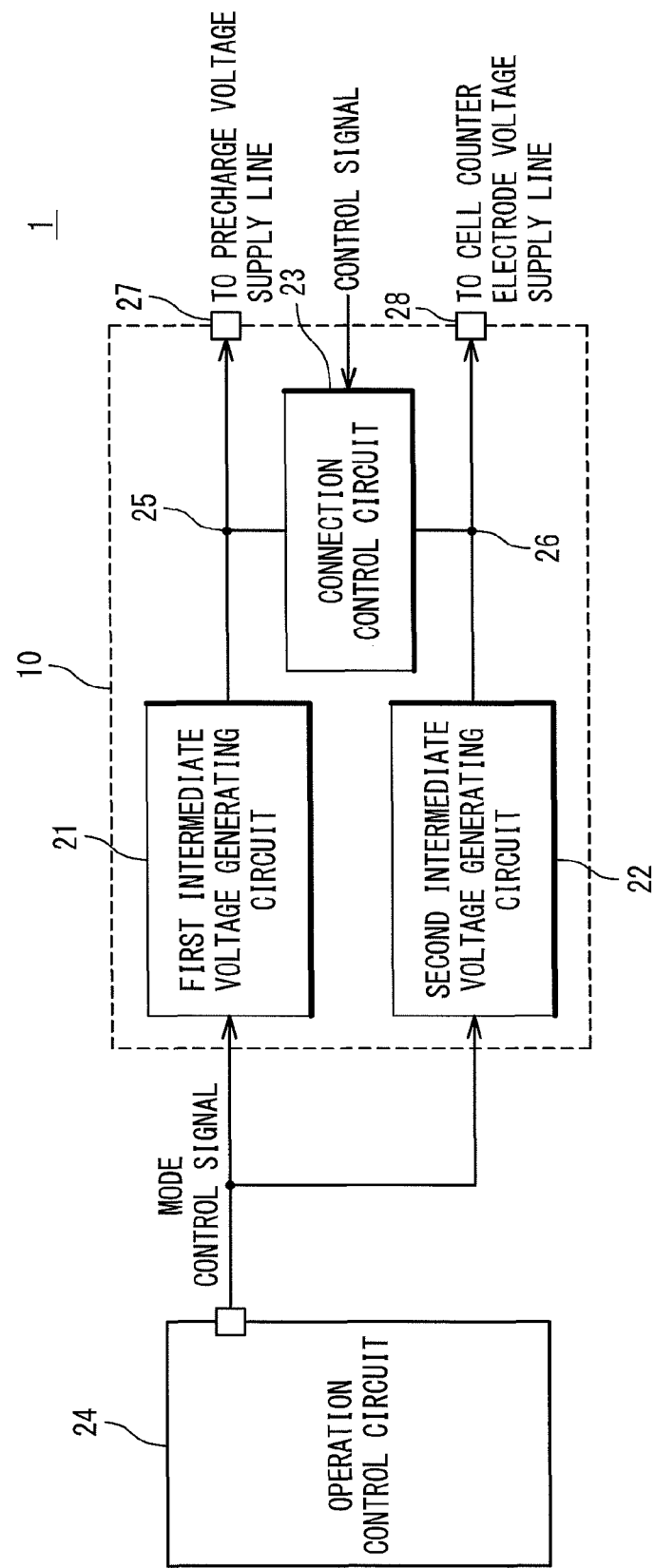
FIG. 3 is a block diagram showing the configuration of a voltage generating block in the present embodiment.

FIG. 3 is a block diagram showing the configuration of the voltage generating block 10 in the present embodiment. The voltage generating block 10 supplies a reference voltage for signal detection as a data line voltage in a case of the precharge. Also, the voltage generating block 10 supplies a voltage to prescribe a signal charge quantity to one end of the capacitance element 7b of memory cell 7. The voltage generating block 10 has a function to change a voltage in accordance with a mode (one of a normal operation mode, a standby mode and a test mode). A case will be described in which the voltage generating block 10 generates a half voltage of a power supply voltage (hereinafter, to be described sometimes as ½ Vcc) to facilitate the understanding of present invention.

As shown in FIG. 3, the voltage generating block 10 in the present embodiment is provided with a first intermediate voltage generating circuit 21, a second intermediate voltage generating circuit 22, a connection control circuit 23, a precharge voltage supply line node 27 and the cell counter electrode voltage supply line node 28. Also, the voltage generating block 10 is connected with an operation control circuit 24. The precharge voltage supply line node 27 is connected with the above-mentioned precharge voltage supply lines 11. The cell counter electrode voltage supply line node 28 is connected with the above-mentioned cell counter electrode voltage supply lines 16.

The first intermediate voltage generating circuit 21 and the second intermediate voltage generating circuit 22 perform the switching of the operation mode in response to a mode control signal supplied from the operation control circuit 24. Also, the first intermediate voltage generating circuit 21 and the second intermediate voltage generating circuit 22 generate voltages corresponding to each of the plurality of operation modes. The first intermediate voltage generating circuit 21 supplies the generated voltage to the precharge voltage supply line node 27 through a first node 25. In the same way, the second intermediate voltage generating circuit 22 supplies the generated voltage to the cell counter electrode voltage supply line node 28 through a second node 26.

The second intermediate voltage generating circuit 22 has a function to stop the operation fully in response to the mode control signal. Specifically, the second intermediate voltage generating circuit 22 stops in the standby mode. It should be noted that the second intermediate voltage generating circuit 22 stops the operation fully in response to a stop signal STP as a mode control signal in the voltage generating block 10 of the present embodiment.

The first intermediate voltage generating circuit 21 is connected with the connection control circuit 23 through the first node 25. The second intermediate voltage generating circuit 22 is connected with the connection control circuit 23 through the second node 26. The connection control circuit 23 switches the connection between the first node 25 and the second node 26 in response to a control signal corresponding to the plurality of operation modes.

The first intermediate voltage generating circuit 21 and the second intermediate voltage generating circuit 22 in the present embodiment will be described below. In the voltage generating block 10 in the present embodiment, the first intermediate voltage generating circuit 21 and the second intermediate voltage generating circuit 22 has a same configuration. Therefore, only the first intermediate voltage generating circuit 21 will be described. Also, it is supposed that the first intermediate voltage generating circuit 21 generates a half voltage (½ Vcc) of a power supply voltage.

Figure 4:
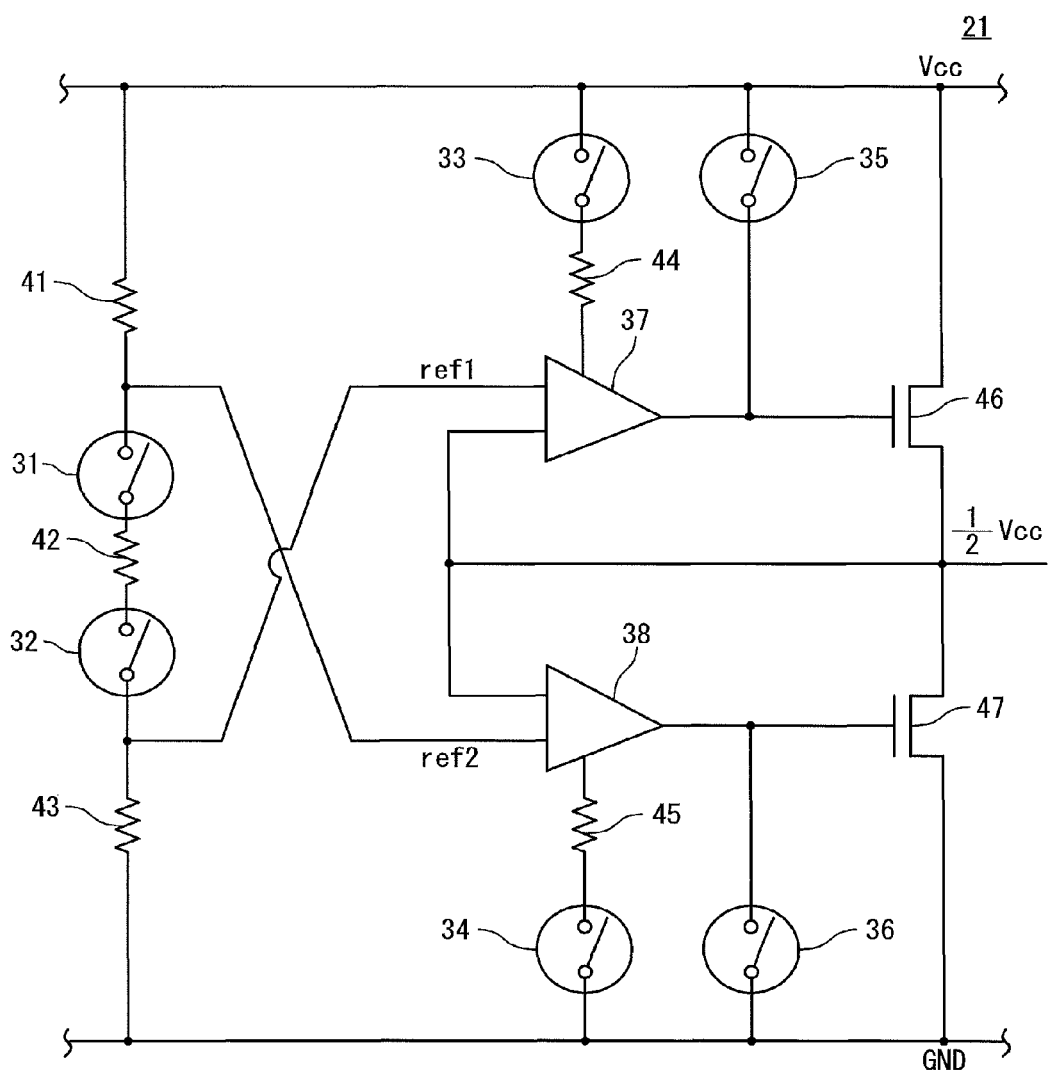
FIG. 4 is a circuit diagram showing the configuration of a first intermediate voltage generating circuit in the present embodiment.

FIG. 4 is a circuit diagram showing the configuration of the first intermediate voltage generating circuit 21 in the present embodiment. The first intermediate voltage generating circuit 21 includes a plurality of switches 31 to 36, a plurality of resistances 41 to 45, operational amplifiers 37 and 38, and transistors 46 and 47. Each of the plurality of switches 31 to 36 is switched between an ON state and an OFF state in response to the above-mentioned mode control signal.

The operation of the voltage generating block 10 in the semiconductor memory device 1 in the present embodiment will be described below. It should be noted that in the following explanation, it is supposed that the connection control circuit 23 is configured from a single transistor, in order to facilitate the understanding of present invention. The voltage generating block 10 deals with the different operation mode.

FIG. 5A is a block diagram showing a state of voltage generating block 10 in the standby mode. As shown in FIG. 5A, the second intermediate voltage generating circuit 22 in the voltage generating block 10 stops the operation in the standby mode. Also, at this time, the connection control circuit 23 short-circuits the first node 25 and the second node 26. Thus, an amount of power consumed in the second intermediate voltage generating circuit 22 can be reduced. Also, the first intermediate voltage generating circuit 21 is operating in the standby mode. The first intermediate voltage generating circuit 21 supplies a voltage according to the standby mode. The first node 25 and the second node 26 can supply a same voltage to the precharge voltage supply line node 27 and the cell counter electrode voltage supply line node 28 only by the first intermediate voltage generating circuit 27.

FIG. 5B is a block diagram showing a state of the voltage generating block 10 in the test mode. As shown in FIG. 5B, the first intermediate voltage generating circuit 21 and the second intermediate voltage generating circuit 22 in the voltage generating block 10 operate independently in the test mode. Also, at this time, the connection control circuit 23 disconnects the first node 25 from the second node 26. Thus, the test with high degree of freedom can be carried out.

Figure 5C:
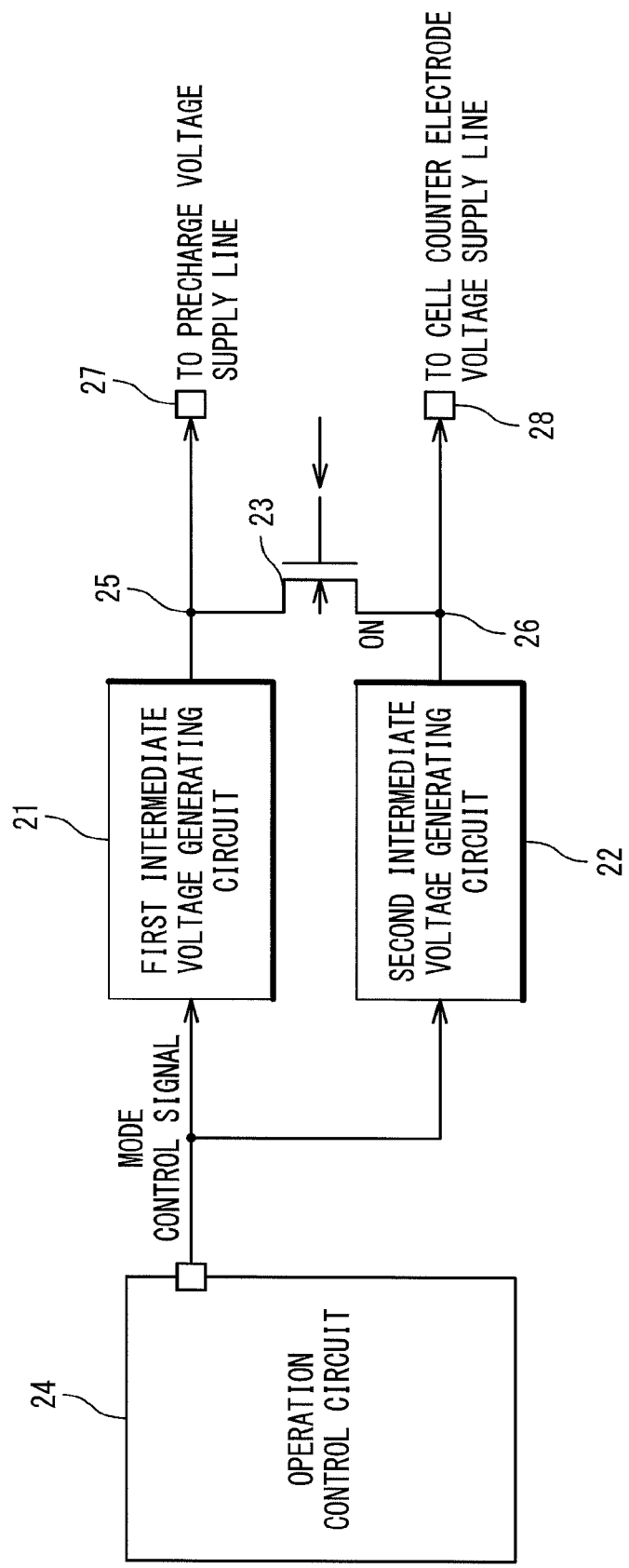
FIG. 5C is a block diagram showing a state of the voltage generating block in a normal operation mode.

FIG. 5C is a block diagram showing a state of the voltage generating block 10 in the normal operation mode. As shown in FIG. 5C, each of the first intermediate voltage generating circuit 21 and the second intermediate voltage generating circuit 22 supplies intermediate voltages between the power supply voltage and the ground voltage in the normal operation mode. Also, at this time, the connection control circuit 23 short-circuits the first node 25 and the second node 26. Thus, the precharge voltage supply line node 27 and the cell counter electrode voltage supply line node 28 can be supplied with a same voltage, and it becomes possible to make the semiconductor memory device 1 operate stably in the normal operation mode.

As described above, the voltage generating block 10 has the function to supply a predetermined voltage between the first power supply voltage and the second power supply voltage. Also, the voltage generating block 10 is provided with a first output node (the precharge voltage supply line node 27) and a second output node (the cell counter electrode voltage supply line node 28). Supposing that the second power supply voltage is lower than the first power supply voltage, a predetermined voltage is supplied to the first output node (the precharge voltage supply line node 27) and the second output node (the cell counter electrode voltage supply line node 28). Also, the voltage generating block 10 is provided with the first intermediate voltage generating circuit 21 and the second intermediate voltage generating circuit 22 respectively connected with the first output node and the second output node (the precharge voltage supply line node 27, the cell counter electrode voltage supply line node 28). Moreover, the voltage generating block 10 is provided with the connection control circuit 23 between the first output node and the second output node (the precharge voltage supply line node 27, the cell counter electrode voltage supply line node 28).

Describing the function of the voltage generating block 10 simply, the voltage generating block 10 supplies a predetermined voltage to the first output node and the second output node (the precharge voltage supply line node 27, the cell counter electrode voltage supply line node 28) by using both of the intermediate voltage generating circuits (the first intermediate voltage generating circuit 21, the second intermediate voltage generating circuit 22) or the first intermediate voltage generating circuit 21 in a combination of the active state of the connection control circuit 23 and the active state of the first intermediate voltage generating circuit 21 and the second intermediate voltage generating circuit 22. The semiconductor memory device 1 in the present embodiment can reduce a power consumption amount in the voltage generating block 10 in the standby mode. Also, in the semiconductor memory device 1 in the present embodiment, the voltage generating block 10 is provided with the first intermediate voltage generating circuit 21 and the second intermediate voltage generating circuit 22 which operate independently. Therefore, the test operation in the test mode can be appropriately executed.

Although the present invention has been described above in connection with several embodiments thereof, it would be apparent to those skilled in the art that those embodiments are provided solely for illustrating the present invention, and should not be relied upon to construe the appended claims in a limiting sense.

What is claimed is:

1. A voltage switch circuit comprising:
   a first intermediate voltage generating circuit configured to generate a first intermediate voltage between a power supply voltage and a ground voltage to a first node in a first mode;
   a second intermediate voltage generating circuit configured to generate a second intermediate voltage between a power supply voltage and a ground voltage to a second node in said first mode;
   a connection control circuit arranged between said first node and said second node;
   wherein said first node is coupled to said second node through said connection control circuit in said first mode and a second mode different from said first mode; and
   a control circuit configured to reduce a power of said second intermediate voltage generating circuit in said second mode less than in said first mode.

2. The voltage switch circuit according to claim 1, wherein said voltage switch circuit is provided for a power supply circuit of a memory.

3. The voltage switch circuit according to claim 1, wherein said first mode is a standby mode.

4. The voltage switch circuit according to claim 1, wherein said connection control circuit connects said first output node and said second output node when said first intermediate voltage generating circuit supplies said first intermediate voltage, and said second intermediate voltage generating circuit supplies said second intermediate voltage.

5. The voltage switch circuit according to claim 4, wherein said connection control circuit comprises a switch which connects said first output node and said second output node in response to at least one of said first control signal and said third control signal, and disconnects said first output node from said second output node in response to said second control signal.

6. The voltage switch circuit according to claim 1, wherein said first intermediate voltage generating circuit and said second intermediate voltage generating circuit generate a half voltage of said power supply voltage.

7. A voltage generating circuit comprising:
   a first intermediate voltage generating circuit coupled to a first output node and configured to generate a first intermediate voltage between a power supply voltage and a ground voltage;
   a second intermediate voltage generating circuit coupled to a second output node and configured to generate a second intermediate voltage between a power supply voltage and a ground voltage; and
   a connection control circuit arranged between said first node and said second node;
   wherein said second output node reflects an output of said first intermediate voltage circuit and does not reflect an output of said second intermediate voltage circuit in a predetermined mode.

8. The voltage generating circuit according to claim 7, wherein said voltage generating circuit is provided for a power supply circuit of a memory.

9. The voltage generating circuit according to claim 7, wherein said predetermined mode is a standby mode.

10. The voltage generating circuit according to claim 7, wherein said connection control circuit connects said first output node and said second output node when said first intermediate voltage generating circuit supplies said first intermediate voltage, and said second intermediate voltage generating circuit supplies said second intermediate voltage.

11. The voltage generating circuit according to claim 10, wherein said connection control circuit comprises a switch which connects said first output node and said second output node in response to at least one of said first control signal and said third control signal, and disconnects said first output node from said second output node in response to said second control signal.

12. The voltage generating circuit according to claim 7, wherein said first intermediate voltage generating circuit and said second intermediate voltage generating circuit generate a half voltage of said power supply voltage.

13. A voltage generating circuit comprising:
   a first intermediate voltage generating circuit coupled to a first node and configured to generate a first intermediate voltage between a power supply voltage and a ground voltage;
   a second intermediate voltage generating circuit coupled to a second node and configured to generate a second intermediate voltage between a power supply voltage and a ground voltage;
   a connection control circuit arranged between said first node and said second node,
   wherein said second intermediate voltage circuit are deactivated and said connection control circuit connects said first node to said second node in a predetermined mode.

14. The voltage generating circuit according to claim 13, wherein said voltage generating circuit is provided for a power supply circuit of a memory.

15. The voltage generating circuit according to claim 13, wherein said predetermined mode is a standby mode.

16. The voltage generating circuit according to claim 13, wherein said connection control circuit connects said first output node and said second output node when said first intermediate voltage generating circuit supplies said first intermediate voltage, and said second intermediate voltage generating circuit supplies said second intermediate voltage.

17. The voltage generating circuit according to claim 16, wherein said connection control circuit comprises a switch which connects said first output node and said second output node in response to at least one of said first control signal and said third control signal, and disconnects said first output node from said second output node in response to said second control signal.

18. The voltage generating circuit according to claim 13, wherein said first intermediate voltage generating circuit and said second intermediate voltage generating circuit generate a half voltage of said power supply voltage.

\* \* \* \* \*